(12) United States Patent
Johnson et al.

(10) Patent No.: US 6,453,105 B1
(45) Date of Patent: Sep. 17, 2002

(54) OPTOELECTRONIC DEVICE WITH POWER MONITORING TAP

(75) Inventors: John Evan Johnson, New Providence, NJ (US); Kishore K Kamath, Whitehall Township, PA (US)

(73) Assignee: Agere Systems Guardian Corp, Orlando, FL (US)

( * ) Notice: Subject to any disclaimer, the term of this patent is extended or adjusted under 35 U.S.C. 154(b) by 27 days.

(21) Appl. No.: 09/678,969

(22) Filed: Oct. 4, 2000

(51) Int. Cl.[7] .................................................. G02B 6/10
(52) U.S. Cl. ........................................ 385/129; 385/131
(58) Field of Search ................................ 385/129, 131; 372/50

(56) References Cited

U.S. PATENT DOCUMENTS

| | | | |
|---|---|---|---|
| 5,029,297 A | | 7/1991 | Halemane et al. ........... 359/333 |
| 5,032,710 A | * | 7/1991 | Nojiri .......................... 250/226 |
| 5,054,871 A | * | 10/1991 | Deri et al. ..................... 385/30 |
| 5,134,671 A | | 7/1992 | Korn et al. .................... 385/14 |
| 5,220,573 A | * | 6/1993 | Sakata et al. ................. 372/50 |
| 5,285,514 A | * | 2/1994 | Nojiri et al. ................. 385/131 |
| 5,889,913 A | * | 3/1999 | Tohyama et al. ........... 385/131 |
| 5,901,265 A | * | 5/1999 | Tohyama et al. ........... 385/131 |
| 6,052,397 A | * | 4/2000 | Jeon et al. .................... 372/46 |

OTHER PUBLICATIONS

"2.5 Gb/s transmission over 680–Kum using . . ."Ketelsen et al., presented at 25th. Optical Fiber Communication Conference, Baltimore, MD, paper PD14, pp. 208–210, May 2000.

* cited by examiner

Primary Examiner—Georgia Epps
Assistant Examiner—M. Hasan
(74) Attorney, Agent, or Firm—Lester H. Birnbaum

(57) ABSTRACT

The invention is a semiconductor device, and a method of fabrication, where a waveguide layer in which light is propagated and an integral photodetector are formed in the device. A light absorbing layer of the photodetector includes a portion of the waveguide layer which is modified to absorb a portion of the light while transmitting the remainder of the light. Additional components, such as a laser, optical amplifier and modulator can be included with the photodetector.

17 Claims, 7 Drawing Sheets

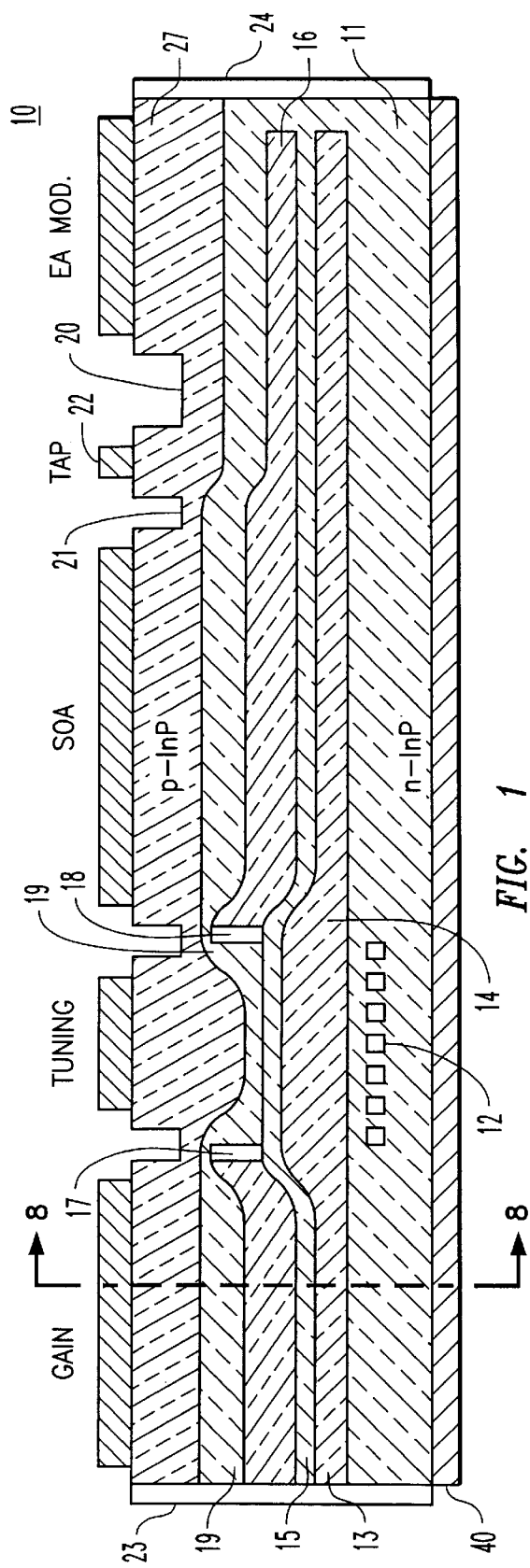
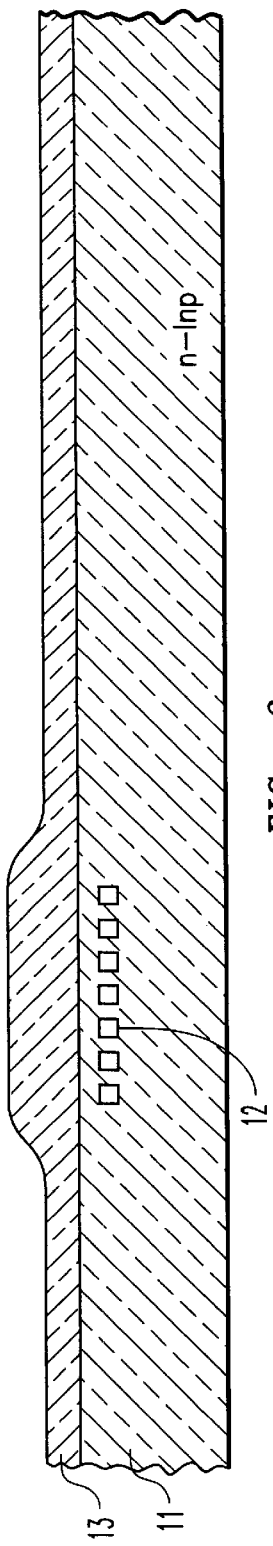
FIG. 1
FIG. 2

OPTOELECTRONIC DEVICE WITH POWER MONITORING TAP

FIELD OF THE INVENTION

This invention relates to optoelectronics, and in particular to an optical device which includes a tap for monitoring the light from the device.

BACKGROUND OF THE INVENTION

Optical fiber networks have become increasingly important in modern communications where large information handling capacity is needed. Of particular interest are Dense Wavelength Division Multiplexing (DWDM) systems where several wavelengths of light from a source are carried by a single fiber. This increase in system complexity has been accompanied by an increase in the complexity and level of integration of the optical components from which they are constructed. The optical sources for such a DWDM system preferably consists of a wavelength tunable semiconductor laser, such as Distributed Bragg Reflector (DBR) laser, integrated with a semiconductor optical amplifier (SOA) to boost the output power, a high speed electroabsorption (EA) modulator, as well as provisions for monitoring and controlling the optical power and wavelength of the output signal. The electrical outputs of these monitors are typically used as part of one or more feedback loops to control the wavelength and output power of the transmitter.

For typical discrete single-section semiconductor lasers, such as Distributed Feedback (DFB) lasers, the unused light emitted from the rear facet of the laser can be directed into an arrangement of wavelength discriminators and photodetectors in order to perform the monitoring functions. This is possible because the fiber-coupled output light is directly proportional to the rear facet light. If additional optical elements such as an SOA are integrated after the laser, then the output power of the integrated laser plus SOA is not necessarily proportional to the back facet light, so this method can no longer be used. A typical approach in these cases is to utilize an optical splitter to tap off a small portion of the output light, and to direct the tapped portion to a photodetector which absorbs all of the light and converts the optical signal to an electrical signal used in a feedback loop. Positioning the splitter outside the chip is not desirable, since it adds expensive components and assembly costs to the transmitter.

It has been recognized that it would be more economical to integrate the splitter and photodetector functions on the same semiconductor chip as the other optical elements. One such device includes a branching waveguide to supply a portion of the light from the amplifier to the photodetector. (See U.S. Pat. No. 5,134,671 issued to Koren, et al.) Another device employs an integrated photodetector with an absorption layer placed with respect to the waveguide propogating light from the amplifier so that it absorbs only a portion of the light from the amplifier. (See U.S. Pat. No. 5,029,297 issued to Halemane et al.) While such devices are effective, it is believed that they add undue complexity to the device structure, either in requiring a branched waveguide or additional layers in the photodetector structure.

It is desirable, therefore to provide an integrated, active semiconductor light emitting device and photodetector which is economical and easily fabricated.

SUMMARY OF THE INVENTION

The invention in accordance with one aspect is a semiconductor device including an active device, a waveguide layer in which light is propogated through the active device, and an integral photodetector formed in the device. A light absorbing layer of the photodetector comprises a portion of the waveguide layer which is made to absorb a portion of the light while transmitting the remainder of the light.

In accordance with another aspect, the invention is a method for forming a semiconductor device wherein a semiconductor waveguide layer adapted for light propogation is formed over a substrate, a portion of the layer is made partially absorbing of the light, an active optical device is formed including the waveguide, and a photodetector device is formed including the partially absorbing portion of the waveguide.

BRIEF DESCRIPTION OF THE FIGURES

These and other features of the invention are delineated in detail in the following description. In the drawing:

FIG. 1 is a cross sectional view of a device in accordance with an embodiment of the invention;

FIG. 2 is a cross sectional view of the device of FIG. 1 during an initial stage of fabrication in accordance with an embodiment of the method aspect of the invention;

It will be appreciated that, for purposes of illustration, these figures are not necessarily drawn to scale.

DETAILED DESCRIPTION

FIG. 1 illustrates an embodiment of the invention in the form of a semiconductor device, 10, which is an electroabsorption modulated (EML), tunable, distributed Bragg reflector (DBR) laser. It will be appreciated that the invention may be employed with other semiconductor optical devices, such as amplifiers, modulators, switches, filters or combinations thereof. It will be noted that various portions of the device are identified by the functions performed by those portions, i.e., Gain, Tuning, SOA (semiconductor optical amplifier), Tap, and EA (electroabsorption) Modulator.

The device, 10, is formed on a semiconductor substrate, 11, which in this example was n-type InP. The substrate typically has a thickness of 100 µm. A portion of the substrate included a grating, 12, of periodic changes in index of refraction which is utilized for tuning of the device in accordance with known techniques.

Deposited over the substrate, 11, including the grating, 12, was a passive waveguide layer, 13. In this example, the layer was InGaAsP, but could be any material which propogates light in the horizontal direction in the figure without providing gain or excessive loss to the signal. It will be noted that the waveguide layer, 13, includes a thicker portion, 14, which is designed to enhance the tuning range of the device.

A spacer layer, 15, comprising n-type InP was deposited on the passive waveguide layer, 13.

A multi-quantum well, separate confinement active layer, 16, was deposited on the layer, 15. In this example, the layers, 16 were InGaAsP and served as the active layer of both the Gain section (laser) and the SOA (amplifier) section of the device, as well as a waveguide for propagation of light through the device. It will be noted that the layer, 16, had two lateral taper portions, 17 and 18, in the Tuning section of the device to facilitate transfer of light between the layer, 16, and underlying passive waveguide, 13, in this section.

Figure 11:
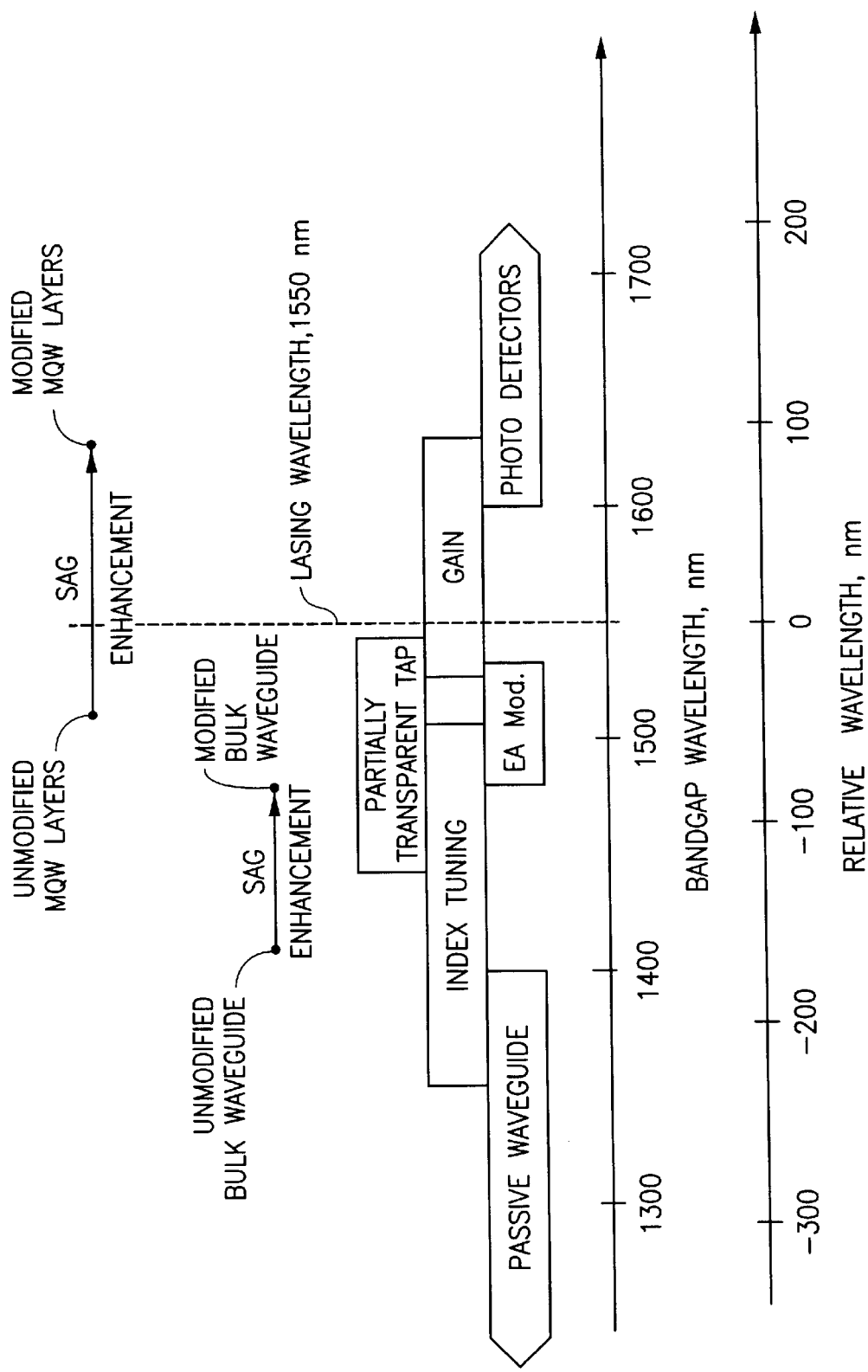
FIG. 11 is a illustration of bandgaps for various layers of the device of FIG. 1.

The bandgap of the multi-quantum well active layer, 16, is engineered to provide different bandgaps in each of the sections of the device depending on the function of that section. This can be achieved by one of several well-known techniques, such as selective area growth (SAG), selective area quantum well interdiffusion, or shadow mask growth, in order to modify the thickness or composition, or both, of the quantum wells in layer 16. The bandgap wavelengths desired for basic optical functions for an operating wavelength of 1550 nm are illustrated in FIG. 11. Also shown in FIG. 11 are illustrative ranges of bandgap achievable by SAG for multi-quantum well (16) and bulk layers (13). In the gain and SOA sections of the device illustrated in FIG. 1, which are designed to provide optical gain at the lasing wavelength of approximately 1550 nm, the bandgap of the quantum wells in layer 16 is approximately 1600 nm. In the EA modulator, which is designed to absorb a variable amount of the output light depending on the applied reverse bias voltage, the bandgap is approximately 1500 nm. In the tap section, which is designed to absorb 1 to 10% of the light at zero bias, the bandgap is approximately 1520 nm. In the preferred embodiment, SAG is used to grow layer 16, resulting in layer 16 being approximately 30% thicker in the active sections than in the modulator. Thus, in this embodiment, the layer 16, as grown will provide the necessary absorption in the tap section, and the portions of layer 16, in the gain and SOA sections can be modified by known SAG techniques to provide necessary gain and low absorption.

Figure 7:
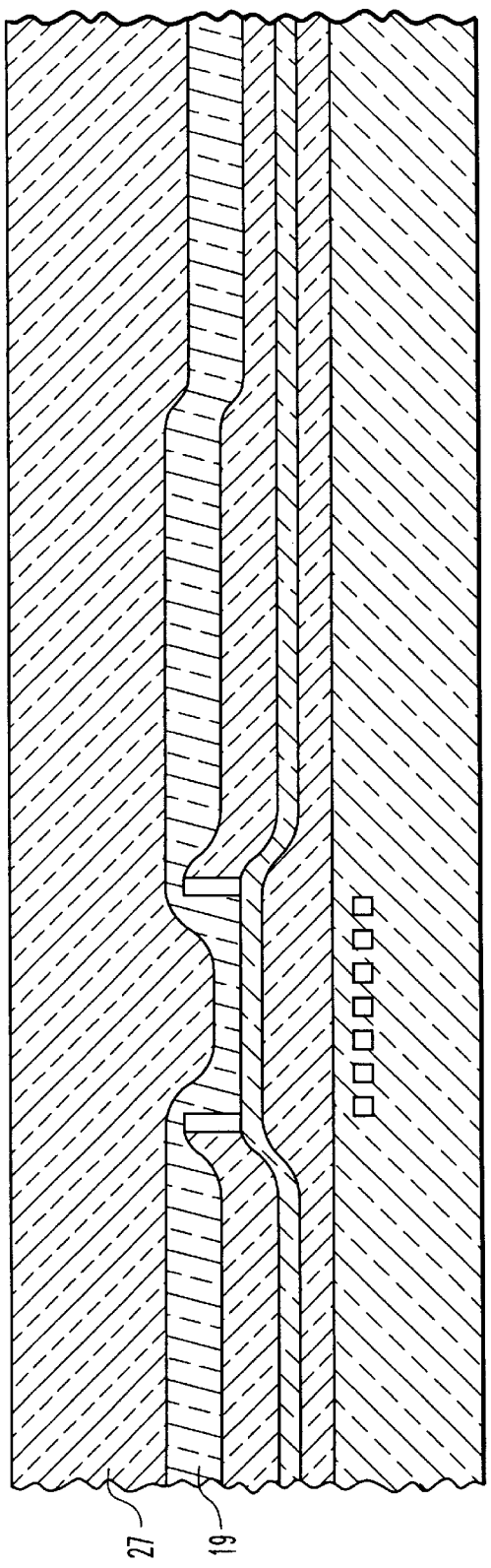
Figure 9:
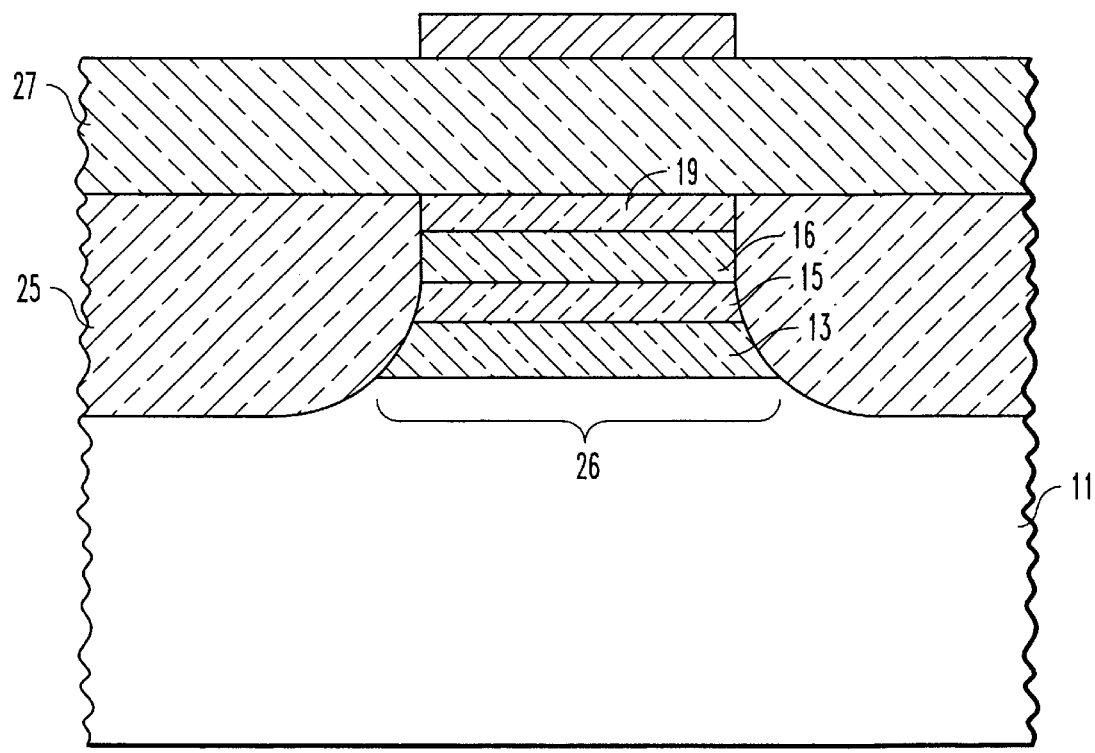
FIG. 9 is another cross-sectional view, along line 8—8 of FIG. 1, of the device.

An additional layer, 19, of semiconductor material, in this example p-type InP with a thickness of 0.5 microns, was formed over the active layer, 16. Then, as illustrated in FIG. 9, the layers 11, 12, 13, 15, 16 and 19 were etched to form a narrow mesa, 26, approximately 10 microns thick, which was then buried on the sides with blocking layers, 25, of n-type, p-type or semi-insulating InP according to standard capped-mesa buried heterostructure techniques. An additional cladding layer, 27, was then formed over the device as also shown in FIG. 7. Isolation grooves, e.g., 20 and 21, were formed in the top surface of the layer, 27, in the boundaries between the different sections of the device. These grooves were typically 2 $\mu$m deep and 20–100 $\mu$m wide. Electrodes, e.g., 22, were deposited on selected areas of the unetched portions of the layer, 27, according to standard techniques. A common ground electrode, 40, was deposited on the bottom surface of the substrate, 11. Also according to standard techniques, a highly reflective layer, 23, was formed on one facet of the device, and an anti-reflective layer, 24, was formed on the opposite facet.

In operation, as presently understood and not by way of limitation, an electrical bias is applied to the Gain section so as to generate light in the active layer, 16, which is coupled into the passive waveguide layer, 13, at the lateral taper region, 17. A desired wavelength is selected by applying an appropriate bias to the Tuning section so as to alter the index of refraction of the grating, 12. The selected wavelength of light is then coupled back into the active layer, 16, in the SOA section through the lateral taper, 18. The light is amplified in the SOA section and coupled into the Tap section.

As previously noted, the thickness and composition of the active layer in the tap section (and the modulator section) is chosen so that a small portion of the light, typically 1–10% is absorbed in this section. The absorption of the light causes charge carriers to be generated which produce a variation in the reverse bias current of this section. This variation is detected so as to provide a measure of the power of the propogating signal through the device. The light which is not absorbed propogates to the EA Modulator section where a signal is impressed on the light according to known techniques. The light is then output at the facet covered by the anti-reflection layer, 24.

Figure 10:
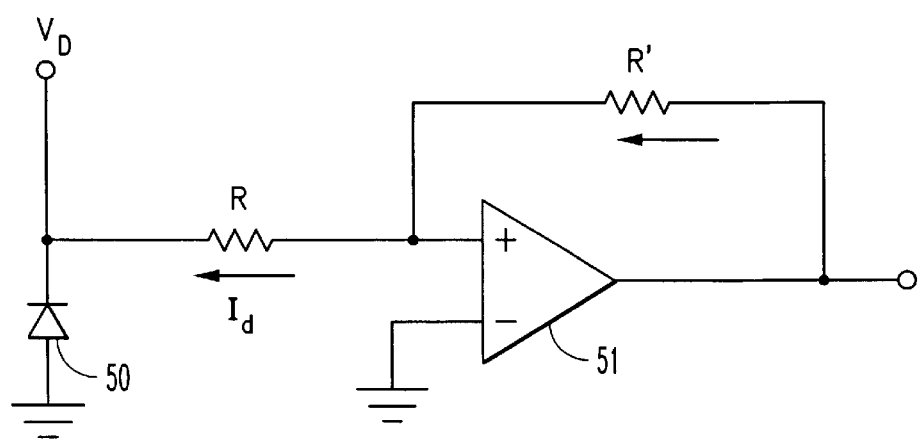
FIG. 10 is a circuit diagram of a portion of the device of FIG. 1.

A schematic illustration of one example of the circuitry for detection is illustrated in FIG. 10. The circuitry includes a pin diode, 50, which is the tap section of the device, 10. The diode is biased by a dc voltage, $V_d$. The diode is coupled to one input of a transimpedance amplifier, 51, through a resistor, R, with the other input coupled to ground potential. A feedback resistor, R', is also usually included. As known in the art, the current, $I_d$, through the resistors will vary according to the power of the optical signal absorbed by the diode. Applicants have discovered that while the current as a function of the power is non-linear, the logarithm of current is linear over a significant range.

It will be appreciated, therefore, that the device according to one aspect of the invention incorporates a semi-transparent optical tap monolithically formed on a semiconductor substrate with other elements of an opto-electronic device. Further, the tap employs the active layer, 16, of the device as the absorbing layer so that no additional layers need to be incorporated in the device. In a preferred embodiment, the tap determines optical power from an amplifier section before the light is modulated. However, the tap can be located in other areas of the device, and the device need not include all the sections shown.

FIGS. 2–8 illustrate one embodiment of a method for forming the device of FIG. 1. It will be appreciated that several devices will be formed on a substrate, 11, and then cut apart. For purposes of illustration, only a single device is shown.

As shown in FIG. 2, a grating, 12, was formed in a major surface of the substrate, 11, according to standard techniques. A layer, 13, comprising InGaAsP was formed selectively over the surface of the substrate, preferably by MOCVD to a total thickness of approximately 100 nm.

Figure 3:
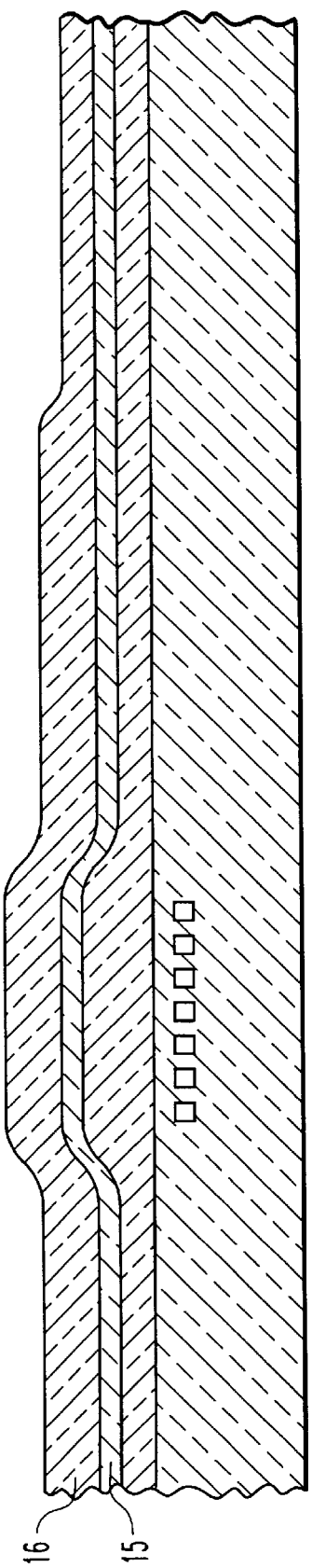
FIGS. 3 and 4 are, respectively, cross sectional and top views of the device during a subsequent stage of fabrication.

Subsequently, as illustrated in FIG. 3, a layer, 15, comprising n-InP was deposited over the layer, 13, preferably by MOCVD to a thickness of approximately 100 nm. This was followed by depositing the layer, 16, comprising alternating layers of InGaAsP, preferably by MOCVD to a total thickness of approximately 200 nm.

Figure 4:
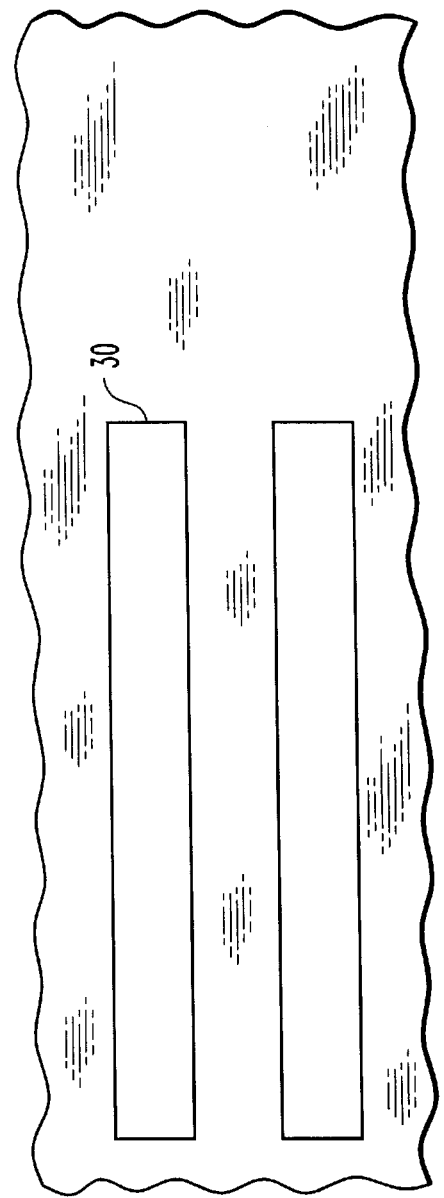

As illustrated in FIG. 4, the layer 16 was selectively formed by Metal Organic Chemical Vapor Deposition (MOCVD) using oxide pads, 30, in a process known in the industry as Selective Area Growth (SAG). The portion of the layer, 16, outside the pads grows thinner and with a smaller band gap wavelength and different composition than the portion between the pads. These differences produce the absorption suitable for the tap section to operate.

Figure 5:
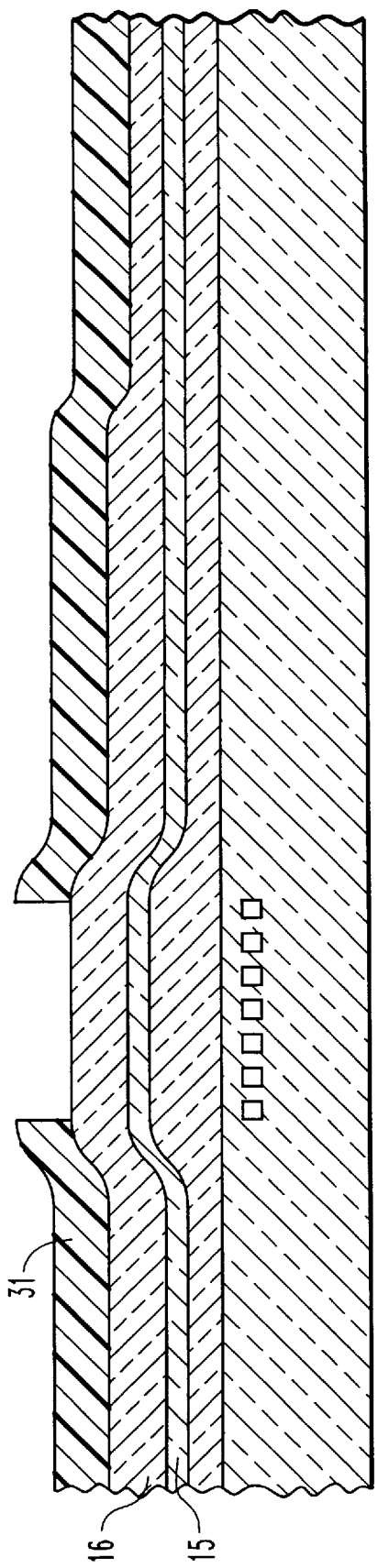
FIGS. 5–7 are cross sectional views of the device during still further stages of fabrication.
Figure 6:
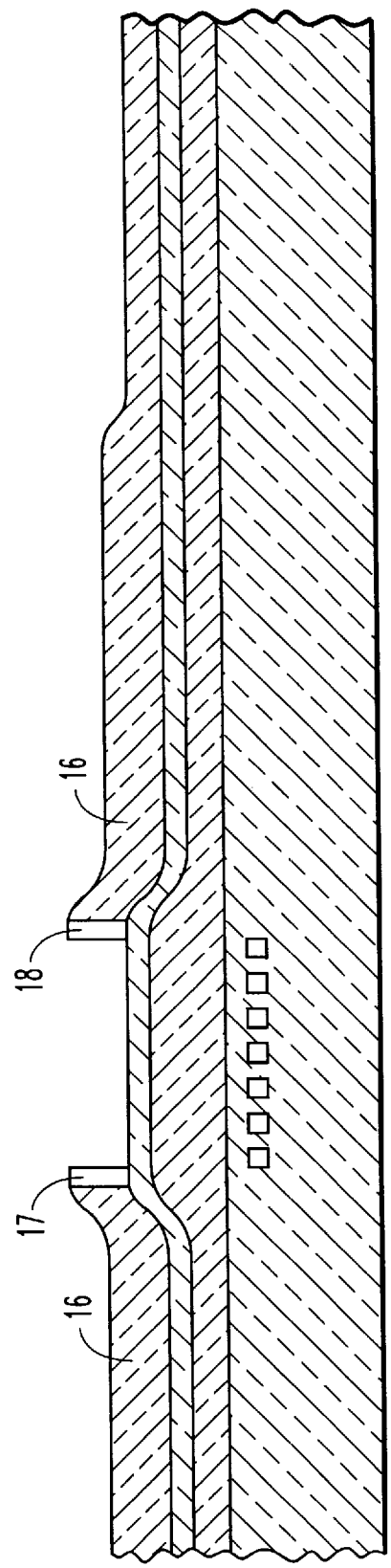

Next, as illustrated in FIG. 5, a photoresist mask, 31, was formed on the layer, 16, by standard photolithographic techniques. The unprotected portion of the layer, 16, (which was over the mesa 14) was etched by standard wet chemical techniques to remove the layer in this portion and to form the lateral taper regions, 17 and 18, of layer, 16, as illustrated in FIG. 6. (For more details on lateral taper formation, see, e.g., U.S. patent application of Johnson et al., Ser. No. 09/228218 filed Jan. 11, 1999 (Johnson 6-19-8-1-3).)

Next, as illustrated in FIG. 7, the cladding layer, 19, was formed over the layer 16, by MOCVD typically to a thickness of 0.5 $\mu$m. This was followed by standard buried heterostructure processes to form the layers of FIG. 9, which were then covered by additional p-type InP cladding layer, 27.

Figure 8:
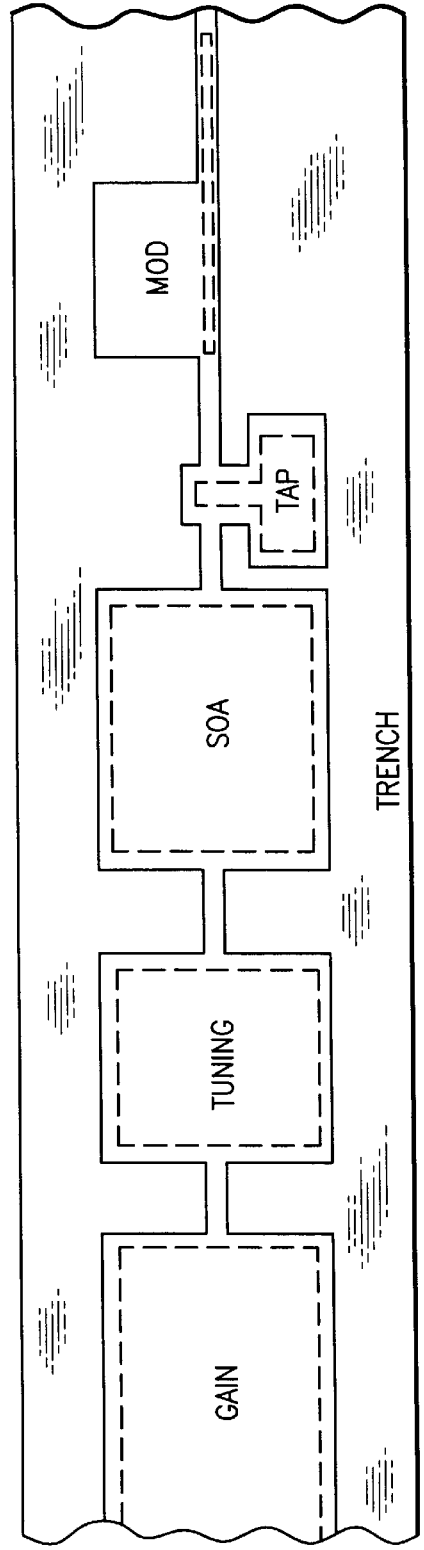
FIG. 8 is a top view of the device during a stage of fabrication subsequent to that shown in FIG. 7.

Finally, as illustrated in the plan view of FIG. 8, trench isolation etching was performed to electrically isolate the various sections of the device. In the figure, the trench is illustrated by the shaded area, and the portions of the device protected from groove formation (e.g., 20 and 21 of FIG. 1) are shown by the dashed lines. The electrodes were then deposited according to standard techniques to produce the device of FIG. 1.

Figure 12:
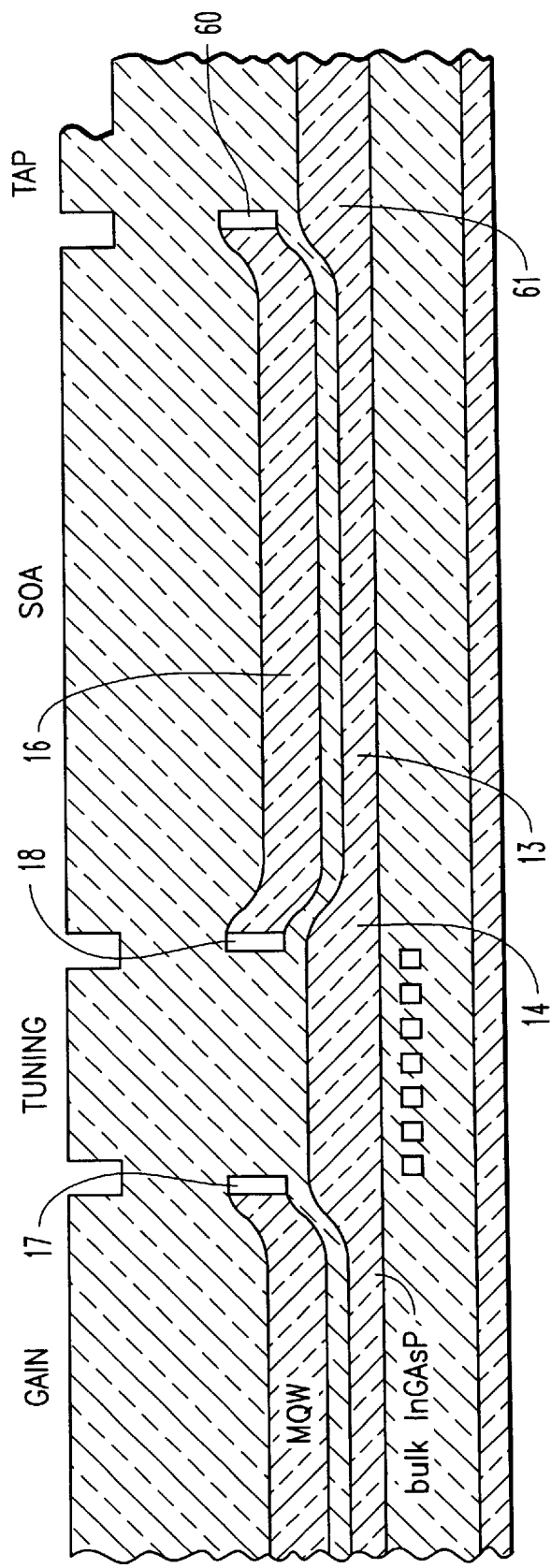
FIG. 12 is a cross sectional view of an alternative embodiment of the invention.

FIG. 12 illustrates an alternative embodiment of the invention. Here, the device is a continuous wave laser with a Gain section, a Tuning section, an SOA section and a Tap section, but no Modulator section, although other combinations of components may be used. In this embodiment, the absorption of light and generation of photocurrent in the tap section takes place in the lower waveguide layer, 13, rather than in the active layer, 16. The active layer, 16, has been etched in the Tap section to leave a lateral taper, 60. An additional mesa portion, 61, has also been formed in the waveguide, 13, in the Tap section. Light propogates through the Gain, Tuning, and SOA sections as before. However, in the Tap section, the light is coupled to the mesa, 61, in the waveguide, 13. The SAG enhancement of the thickness and composition in this section increases the band gap wavelength and causes the waveguide to be slightly absorbing and produce free carriers in response to the incident light (see FIG. 11). Therefore, light power can be detected, and the tap uses a layer common with the other sections as the absorbing layer, with no additional process complexity.

What is claimed is:

1. A semiconductor device comprising:

A waveguide layer in which light is propagated;

an integral photodetector including a light absorbing layer, the light absorbing layer comprising a portion of the waveguide layer which is made to absorb a portion of the light while transmitting the remainder of the light; and wherein the light absorbing layer is adapted to absorb at least 1% of the propogating light.

2. The device according to claim 1 wherein the light absorbing layer comprises a portion of the waveguide wherein the thickness is different from another portion of the waveguide.

3. The device according to claim 1 wherein the light absorbing layer comprises a portion of the waveguide wherein the composition is different from another portion of the waveguide.

4. The device according to claim 1 wherein the photodetector comprises a p-i-n diode.

5. The device according to claim 1 wherein the photodetector comprises a p-n diode.

6. The device according to claim 4, wherein the photodetector includes an n-type substrate, an n-type passive waveguide layer, an intrinsic layer, and a p-type layer.

7. The device according to claim 6 wherein the n-type and p-type layers comprise InP, the passive waveguide comprises InGaAsP and the intrinsic layer comprises alternating layers of InGaAsP.

8. The device according to claim 1 further comprising a gain section, a tuning section, an amplifier section, and a modulator section.

9. The device according to claim 8 wherein the photodetector is between the amplifier and modulator sections.

10. A method for forming a semiconductor device comprising:

forming a semiconductor waveguide layer adapted for light propagation over substrate; so that a portion of the waveguide is partially absorbing of the light;

forming an active optical device including a portion of the waveguide;

forming a photodetector device including the portion of the waveguide which is absorbing a portion of the light while transmitting remainder of the light; and wherein the waveguide layer is made to absorb at least 1% of the propogating light.

11. The method according to claim 10 wherein the waveguide layer is an active layer.

12. The method according to claim 11 wherein the absorbing portion of the active layer is formed thinner than another portion of the active layer.

13. The method according to claim 11 wherein the absorbing portion of the active layer is modified by changing the composition of the active layer in that portion.

14. The method according to claim 11 wherein the absorbing portion of the active layer is formed thinner than and with a different composition than another portions of the active layer.

15. The method according to claim 11 wherein the active layer is formed by selective area MOCVD growth.

16. The method according to claim 11 further comprising forming a passive waveguide layer between the substrate and the active layer.

17. The method according to claim 10 further comprising forming a gain section, a tuning section, an amplifier section, and a modulator section on the substrate along with the photodetector, the gain section, amplifier section and modulator section including the active layer.

\* \* \* \* \*